(12) United States Patent
Ikeda

(10) Patent No.: US 8,659,052 B2
(45) Date of Patent: Feb. 25, 2014

(54) SEMICONDUCTOR DEVICE AND METHOD FOR MANUFACTURING THE SAME

(75) Inventor: Tomoharu Ikeda, Nisshin (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 13/616,171

(22) Filed: Sep. 14, 2012

(65) Prior Publication Data
US 2013/0075784 A1    Mar. 28, 2013

Related U.S. Application Data

(63) Continuation of application No. PCT/JP2011/072273, filed on Sep. 28, 2011.

(51) Int. Cl.
*H01L 27/07*       (2006.01)
*H01L 21/02*       (2006.01)

(52) U.S. Cl.
USPC .... 257/140; 257/133; 257/370; 257/E29.197; 438/133

(58) Field of Classification Search
CPC ............ H01L 27/0711; H01L 27/0716; H01L 27/0722; H01L 27/0788; H01L 27/075; H01L 27/0755; H01L 27/0761; H01L 27/0783; H01L 27/0727
USPC .......................................... 257/133; 438/165
See application file for complete search history.

(56) References Cited

U.S. PATENT DOCUMENTS

| | | | |
|---|---|---|---|
| 6,274,460 B1 * | 8/2001 | Delgado et al. | 438/476 |
| 2005/0258493 A1 | 11/2005 | Ono et al. | |
| 2007/0080407 A1 * | 4/2007 | Kono | 257/370 |
| 2009/0140330 A1 | 6/2009 | Yagi et al. | |
| 2009/0278166 A1 * | 11/2009 | Soeno et al. | 257/133 |
| 2010/0283514 A1 | 11/2010 | Soeno et al. | |
| 2011/0298044 A1 | 12/2011 | Yagi et al. | |

FOREIGN PATENT DOCUMENTS

| | | |
|---|---|---|
| JP | 1-238026 A | 9/1989 |
| JP | 7-201842 A | 8/1995 |
| JP | 11-266010 A | 9/1999 |
| JP | 2005-317751 A | 11/2005 |
| JP | 2007-103770 A | 4/2007 |

(Continued)

OTHER PUBLICATIONS

International Search Report & Written Opinion mailed Nov. 22, 2011 of PCT/JP2011/072273.

*Primary Examiner* — Kevin Parendo
*Assistant Examiner* — Pauline Vu
(74) *Attorney, Agent, or Firm* — Kenyon & Kenyon LLP

(57) ABSTRACT

A semiconductor device including a semiconductor substrate in which a diode region and an IGBT region are formed is provided. The diode region includes a first layer embedded in a diode trench reaching a diode drift layer from an upper surface side of the semiconductor substrate, and a second layer which is buried in the first layer and which has a lower end located deeper than a boundary between a diode body layer and the diode drift layer. The second layer pressures the first layer in a direction from inside to outside of the diode trench. A lifetime control region is formed in the diode drift layer at least at the depth of the lower end of the second layer, and a crystal defect density inside the lifetime control region is higher than a crystal defect density outside the lifetime control region.

4 Claims, 10 Drawing Sheets

(56) References Cited

FOREIGN PATENT DOCUMENTS

| | | |
|---|---|---|
| JP | 2008-192737 A | 8/2008 |
| JP | 2009-065105 A | 3/2009 |
| JP | 2009-141005 A | 6/2009 |
| JP | 2010-263149 A | 11/2010 |
| JP | 2011-166052 A | 8/2011 |

* cited by examiner

SEMICONDUCTOR DEVICE AND METHOD FOR MANUFACTURING THE SAME

CROSS-REFERENCE TO RELATED APPLICATION

This application is a continuation of PCT application PCT/JP2011/072273 filed on Sep. 28, 2011 designating the United States of America, the entire contents of which are incorporated by reference herein.

TECHNICAL FIELD

The technique described in the present description relates to a semiconductor device and a method for manufacturing the same.

DESCRIPTION OF RELATED ART

Japanese Patent Application Publication No. 2007403770 and Japanese Patent Application Publication No. 2008492737 disclose semiconductor devices each having a semiconductor substrate in which a diode region and an IGBT region are formed. A damage layer for controlling a lifetime of a carrier is formed in diode regions of these semiconductor devices in order to enhance recovery characteristics of a diode. The damage layer is formed by irradiating light ions or the like in a depth direction of the semiconductor substrate. In order to selectively form the damage layer in the diode region, the light ions or the like are irradiated in a state in which regions of the semiconductor substrate where the damage layer is not formed are covered by a mask.

SUMMARY

When irradiating light ions or the like using a mask, an alignment adjustment for aligning a position of a damage layer and a position of a diode region must be performed. When alignment accuracy is insufficient and a position where the mask is formed is inappropriate, the damage layer ends up being also formed in an IGBT region. When the damage layer is funned in the IGBT region, IGBT characteristics may decline such as an increase in loss due to an increase in an on-resistance of an IGBT.

An object of the present application is to provide a configuration of a semiconductor device that enables a damage layer to be selectively funned in a diode region without having to irradiate light ions or the like using a mask, and a method for manufacturing the semiconductor device.

The present description discloses a semiconductor device comprising a semiconductor substrate in which a diode region and an IGBT region are formed. The diode region comprises: a first conductivity type anode layer exposed at an upper surface of the semiconductor substrate; a first conductivity type diode body layer formed on a lower surface side of the anode layer; a second conductivity type diode drift layer formed on a lower surface side of the diode body layer; a second conductivity type cathode layer formed on a lower surface side of the diode drift layer, and having a higher density of second conductivity type impurities than in the diode drift layer; a first layer disposed within a diode trench reaching the diode drift layer from the upper surface side of the semiconductor substrate; and a second layer disposed within the first layer, and having a lower end of the second layer located deeper than a boundary between the diode body layer and the diode drift layer. The IGBT region comprises: a second conductivity type emitter layer exposed at the upper surface of the semiconductor substrate; a first conductivity type IGBT body layer formed at a lateral side and a lower surface side of the emitter layer, and having a part of which exposed at the upper surface of the semiconductor substrate; a second conductivity type IGBT drift layer formed on as lower surface side of the IGBT body layer; a first conductivity type collector layer formed on a lower surface side of the IGBT drift layer; and an IGBT gate penetrating the IGBT body layer from the upper surface side of the semiconductor substrate and reaching the IGBT drift layer. The second layer pressures the first layer in a direction from inside to outside of the diode trench. A lifetime control region is formed in the diode drift layer at least at a depth of a lower end of the second layer, and a crystal defect density inside the lifetime control region is higher than a crystal defect density outside the lifetime control region.

According to the semiconductor device described above, the second layer pressures the first layer in the direction from inside to outside of the diode trench. Therefore, the first layer is pressured in a range where the second layer is formed and is not pressured in a range where the second layer is not thinned. As a result, a lifetime control region with the high crystal defect density is formed at least in a vicinity of the depth of the lower end of the second layer in the semiconductor substrate. Since the lower end of the second layer is located deeper than a boundary between the diode body layer and the diode drift layer, the lifetime control region is formed in the diode drift layer. A semiconductor device that enables a damage layer to be selectively formed in a diode region without having to irradiate light ions or the like using a mask can be provided. Since a lifetime control region is formed in correspondence with the position of the diode trench, alignment adjustment is not required and superior repeatability is achieved. Since alignment adjustment and irradiation of light ions or the like are no longer necessary, a manufacturing process can be simplified and, at the same time, the semiconductor device that enables the lifetime control region to be accurately formed can be provided.

DETAILED DESCRIPTION OF INVENTION

Figure 1:
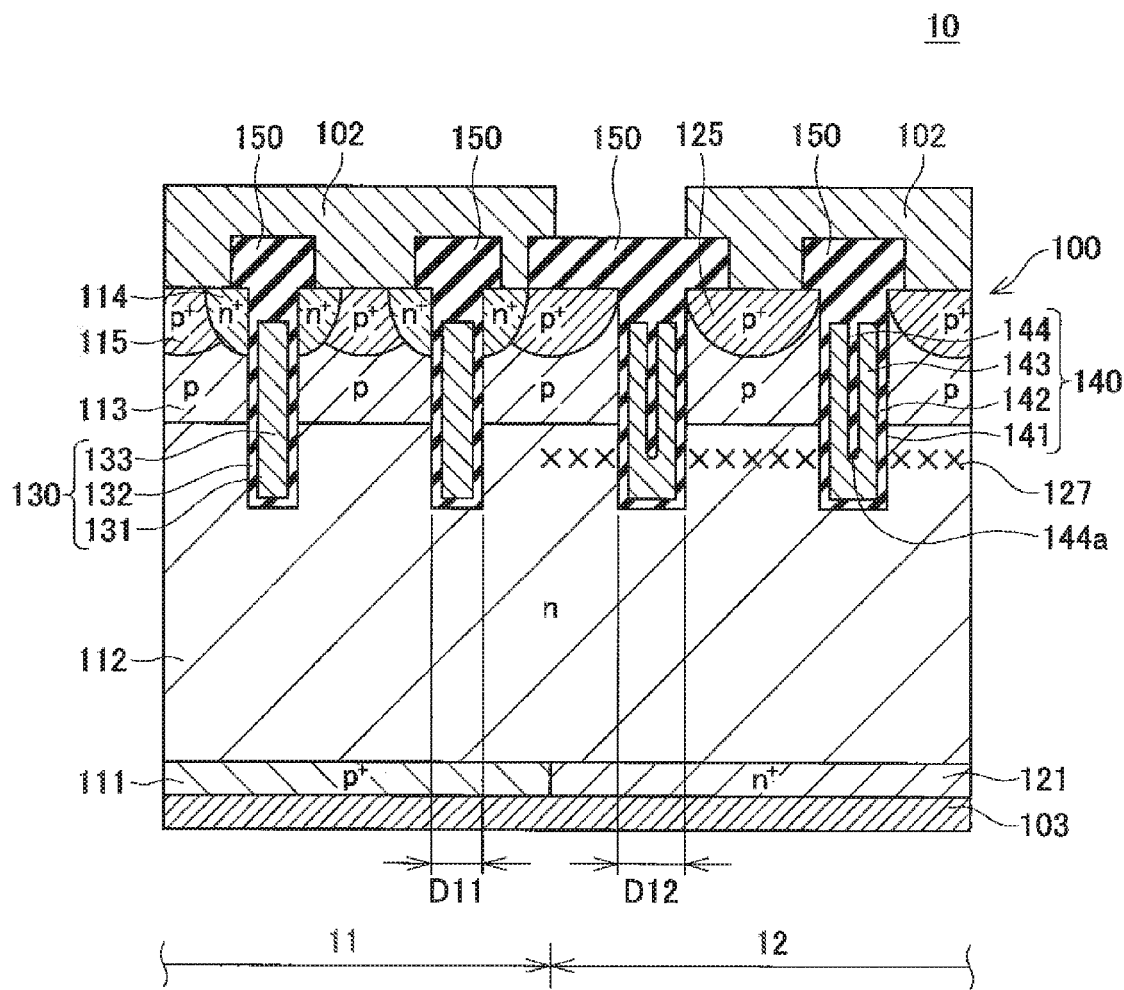
FIG. 1 is a cross sectional view of a semiconductor device according to a first embodiment.

The present description discloses a semiconductor device comprising a semiconductor substrate in which a diode region and an IGBT region are formed. In the diode region, a vertical diode trench that reaches a diode drift layer from an upper surface side of the semiconductor substrate is formed. A first layer may be embedded in the diode trench, and a second layer may be buried in the first layer. A lower end of the second layer may be located deeper than a boundary between a diode body layer and the diode drift layer. The second layer may pressure the first layer in a direction from inside to outside of the diode trench. A lifetime control region may be formed in the diode drift layer. The lifetime control region may be formed in a vicinity of the lower end of the second layer. More specifically, the lifetime control region may be formed at least at the depth of the lower end of the second layer, and may further spread to above (an upper surface side of the semiconductor substrate) or below (a lower surface of the semiconductor substrate) of the depth of the lower end of the second layer.

A same material as used for a gate electrode formed in the IGBT region may be used for the first layer. By using the same material as used for the gate electrode of the IGBT region as a first material which is a material of the first layer, forming of the first layer and forming of the gate electrode may be combined with each other. Materials that can be favorably used as the first material include, but are not limited to, polysilicon, silicon nitride (SiN$_x$), silicon germanium (SiGe), and silicon carbide (SiC). The first layer may be isolated from an upper surface electrode (for example, an emitter electrode) formed on an upper surface of the semiconductor substrate by an insulating film. Alternatively, the first layer and the upper surface electrode may be electrically connected to each other.

The second layer need only be buried in the first layer and pressure the first layer in the direction from inside to outside of the diode trench. For example, the second layer may be formed by filling a material that expands in volume when thermally treated into a void in the first layer. Alternatively, the second layer may be formed by performing heat treatment and using a material which is generated in the void in the first layer and which expands in volume. Due to generation or to volume expansion of the second layer by a heat treatment, the second layer pressures the first layer from inside to outside of the diode trench. A second material to be used as a material of the second layer is favorably generated or expands in volume in the heat treatment (for example, fanning a silicone oxide film such as a surface insulating film or a heat treatment in annealing after injecting impurity ions) which is normally performed in the manufacturing process of the semiconductor device.

The second layer is favorably an oxide formed by oxidizing the first layer. In this case, favorably, the first layer is first formed in a state of including a void, and the second layer is subsequently formed by oxidizing a portion facing the void of the first layer and growing an oxide film on the upper surface of the first layer inside the void. The step of forming the second layer can be performed using the heat treatment which is normally performed in the manufacturing process of the semiconductor device. Moreover, in the present description, "the first layer including a void" means that upper surfaces of the first layer are separated from each other via a space or are in contact with each other inside the diode trench. The second layer need only be able to at least fill the void during the forming, and favorably expands so as to exceed a volume of the void.

Moreover, the semiconductor device according to the present application may comprise a buffer layer in contact with a lower surface of the drift layer, and a collector layer and a cathode layer may be formed in contact with a lower surface of the buffer layer. In addition, the first layer and the second layer may be isolated from an upper surface electrode or may be in contact with the upper surface electrode.

The semiconductor device disclosed in the present application may be readily manufactured using a method for manufacturing a conventional semiconductor device. Without having to add a complicated manufacturing process, the first layer and the second layer can be formed inside the trench formed in the diode region, and the gate electrode can be filled into the trench formed in the IGBT region in the state of not including the void. In particular, when the first layer and the gate electrode are made of the same material or when, further, the second layer is the oxide generated by thermally treating the first layer, the first layer and the second layer of the diode region can be formed at the same time by forming the gate electrode, a surface insulating film, or the like. Therefore, the number of steps can be further reduced. For example, by setting a trench width (a width in a direction perpendicular to a longitudinal direction of the trench) of the diode gate wider than a trench width of the IGBT gate, the first layer in the state of including the void can be formed inside the diode trench, and the gate electrode can be filled into the IGBT trench in the state of not including the void. In addition, the first layer and the gate electrode may be formed in a similar manner by adopting an inclined design in which the trench width of the IGBT gate becomes narrower from the upper surface side to the lower surface side of the semiconductor substrate while the trench width of the diode gate stays constant in the depth direction of the semiconductor substrate.

Furthermore, when the lifetime control region is formed by forming the second layer, a position at which the lifetime control region is formed has greater repeatability compared to a conventional case of irradiating charged particles. According to the present application, by studying a relationship between positions of the second layer and the like and a position of the lifetime control region by an experiment or a simulation in advance, the lifetime control region can be formed at an appropriate position with favorable repeatability. Since repeatability can be secured, a spacing between the IGBT region and the diode region need not be set wide in consideration of production tolerance. Therefore, even if the spacing between the IGBT region and the diode region is designed narrower than what is conventional, the lifetime control region can be prevented from being formed inside the IGBT region.

FIRST EMBODIMENT (Semiconductor Device)

A semiconductor device 10 shown in FIG. 1 is an IRC-IGBT comprising a semiconductor substrate 100 in which an IGBT and a diode are formed.

The semiconductor device 10 comprises: the semiconductor substrate 100; insulated gates 130, dummy gates 140, and upper surface insulating films 150 formed on an upper surface side of the semiconductor substrate 100; upper surface electrodes 102 in contact with the upper surface of the semiconductor substrate 100; and a lower surface electrode 103 in contact with a lower surface of the semiconductor substrate 100. The semiconductor substrate 100 comprises an IGBT region 11 and a diode region 12. The insulated gates 130 and the dummy gates 140 are respectively formed in the semiconductor substrate 100 at approximately constant intervals.

The semiconductor substrate 100 comprises $n^+$ type emitter layers 114, $p^+$ type body contact layers 115, $p^+$ type anode layers 125, a p type body layer 113, an n type drift layer 112, a $p^+$ type collector layer 111, and an $n^+$ type cathode layer 121. The emitter layers 114, the body contact layers 115, and the anode layers 125 are exposed at the upper surface of the semiconductor substrate 100 and are in contact with the upper surface electrode 102. The body layer 113 is formed on lower surfaces of the emitter layers 114, the body contact layers 115, and the anode layers 125. The drift layer 112 is formed on a lower surface of the body layer 113. The collector layer 111 and the cathode layer 121 are firmed on a lower surface of the drift layer 112. The collector layer 111, the body contact layers 115, and the anode layers 125 have a higher density of p type impurities than in the body layer 113. The emitter layers 114 and the cathode layer 121 have a higher density of n type impurities than in the drift layer 112. In the semiconductor device 10, a diode drift layer and an IGBT drift layer are formed as a single layer (the drift layer 112). Among the drift layer 112, a portion included in the IGBT region 11 is the IGBT drift layer and a portion included in the diode region 12 is the diode drift layer. In addition, in the semiconductor device 10, a part of a diode body layer and an IGBT body layer are formed as a single layer (the body layer 113). Among the body layer 113, a portion included in the IGBT region 11 is an IGBT body layer and a portion included in the diode region 12 is a diode body layer. The IGBT body layer further comprises the body contact layer 115.

In the IGBT region 11, the insulated gates 130 penetrating the body layer 113 from the upper surface side of the semiconductor substrate 100 and reaching the drift layer 112 are formed. Each insulated gate 130 comprises a gate insulating film 132 formed on an inner wall of a trench 131 formed on an upper surface side of the semiconductor substrate 100, and a gate electrode 133 which is covered by the gate insulating film 132 and which is filled into the trench 131. The insulated gates 130 are in contact with the body layer 113 of a portion that isolates the emitter layers 114 and the drift layer 112 from each other. The gate electrodes 133 are isolated from the upper surface electrode 102 by the upper surface insulating films 150.

In the diode region 12, the dummy gates 140 penetrating the body layer 113 from the upper surface side of the semiconductor substrate 100 and reaching the drift layer 112 are formed. Each dummy gate 140 comprises a dummy gate insulating film 142 formed on an inner wall of a trench 141, a first layer 143 which is covered by the dummy gate insulating film 142 and which is filled into the trench 141, and a second layer 144 buried in the first layer 143. The dummy gates 140 are in contact with the body layer 113. Each first layer 143 is isolated from the upper surface electrode 102 by the upper surface insulating film 150. A trench width D12 of the dummy gates 140 is wider than a trench width D11 of the insulated gates 130. Each second layer 144 extends along a longitudinal direction of the dummy gate 140. In addition, a lower end 144a of each second layer 144 is located deeper than a boundary between the body layer 113 and the drift layer 112. In a range in which the second layers 144 are formed along a depth direction of the semiconductor substrate 100, the second layers 144 respectively pressure the first layers 143 in a direction from inside to outside of the trenches 141. The first layers 143 are not pressured in a range in which the second layers 144 are not formed. Each second layer 144 is in contact with the first layer 143 in a lower surface direction of the semiconductor substrate 100, in a longitudinal direction of the dummy gate, and in a trench width direction (a crosswise direction). In addition, each second layer 144 is in contact with the upper surface insulating films 150 in an upper surface direction of the semiconductor substrate 100. The gate electrodes 133 and the first layers 143 are formed from a same material (polysilicon). The second layers are made of a material that is an oxide (silicon oxide) of the first layers 143.

A lifetime control region 127 is formed in the drift layer 112 inside the diode region 52. The lifetime control region 127 extends to a boundary between the IGBT region 11 and the diode region 11 (consistent with a boundary between the collector layer 111 and the cathode layer 121) but is not formed inside the IGBT region 11. The lifetime control region 127 is formed at the depth of the lower ends 144a of the second layers 144 and in a vicinity thereof, and spreads in a planar direction of the semiconductor substrate 100 at this depth. A crystal defect density inside the lifetime control region 127 is higher than a crystal defect density in the drift layer 112 outside the lifetime control region 127. Due to the lifetime control region 127 being formed in the diode region 12, a lifetime of a carrier is reduced and diode characteristics (for example, recovery characteristics) can be improved. On the other hand, since the lifetime control region 127 is not formed in the IGBT region 11, IGBT characteristics are not impaired (for example, an increase of an on-resistance of the IGBT).

(Method for Manufacturing Semiconductor Device)

A method for manufacturing the semiconductor device 10 will now be described with a focus on manufacturing processes of the insulated gates 130 and the dummy gates 140. As already described earlier, the first material which is the material of the first layers 143 is polysilicon and the second material which is the material of the second layers 144 is silicon oxide that is the oxide of the first material.

Figure 2:
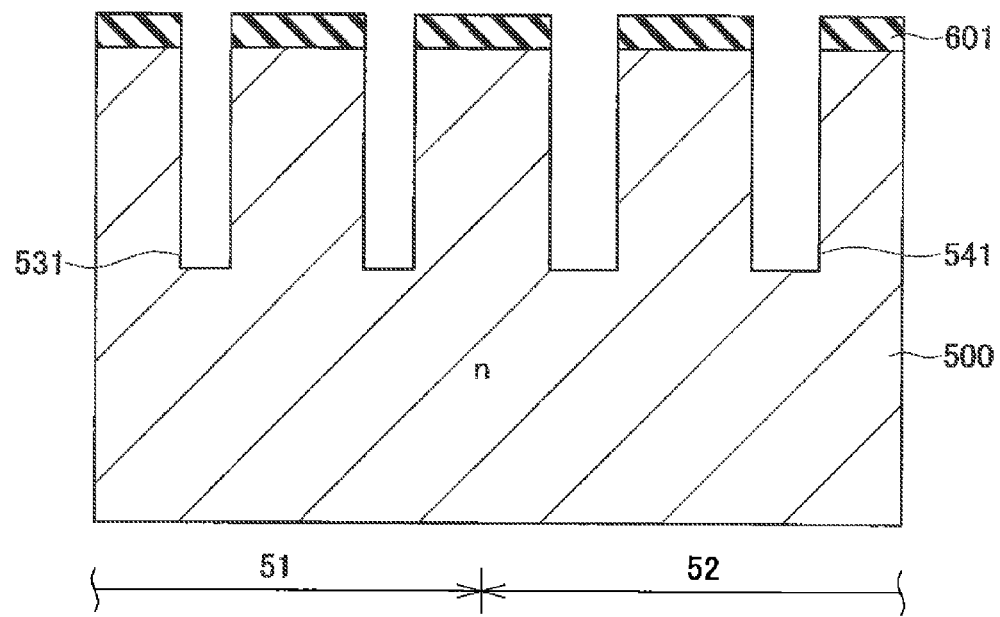
FIG. 2 is a diagram illustrating a method for manufacturing the semiconductor device according to the first embodiment.

First, a semiconductor wafer 500 is prepared. The semiconductor wafer 500 is an n type silicon wafer. As shown in FIG. 2, a patterned resist 601 is formed on an upper surface of the semiconductor wafer 500 and the silicon wafer is etched. Accordingly, trenches 531 are formed in the IGBT region 51 and trenches 541 are formed in the diode region 52. In a similar manner to FIG. 1, the trenches 531 have the width of all and the trenches 541 have a width of D12(D11<D12). Moreover, a silicon nitride film can be used instead of the resist 601.

Figure 3:
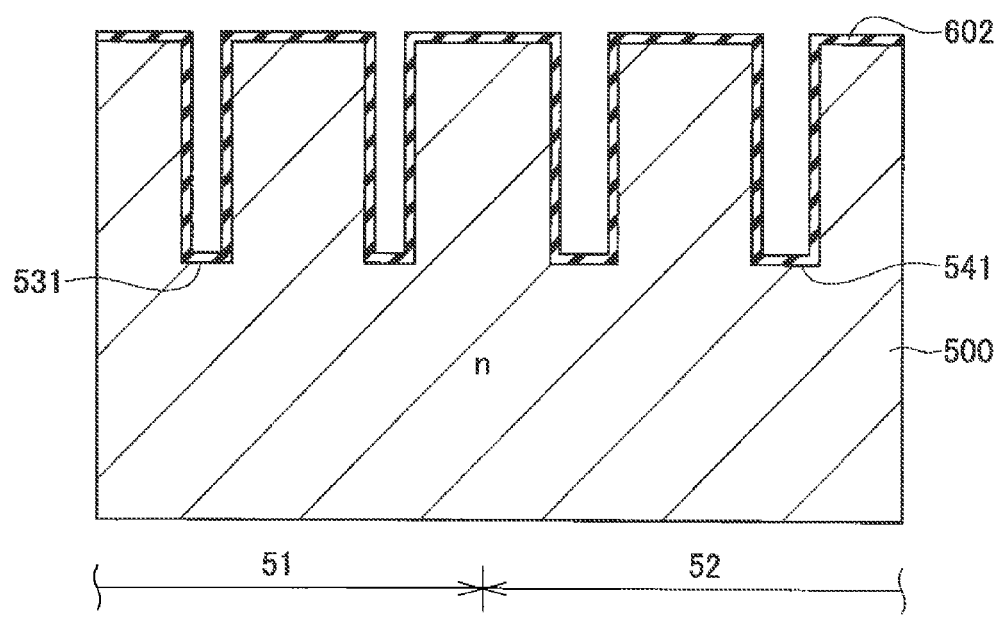
FIG. 3 is a diagram illustrating the method for manufacturing the semiconductor device according to the first embodiment.

Next, the resist 601 is removed, and after performing a treatment (chemical dry etching, sacrificial oxidation, or the like) to remove a damage layer during the etching, surface oxidation is performed. Accordingly, as shown in FIG. 3, an oxide layer 602 that is an insulating film is formed on the upper surface of the semiconductor wafer 500 and on inner walls of the trenches 531 and 541.

Figure 4:
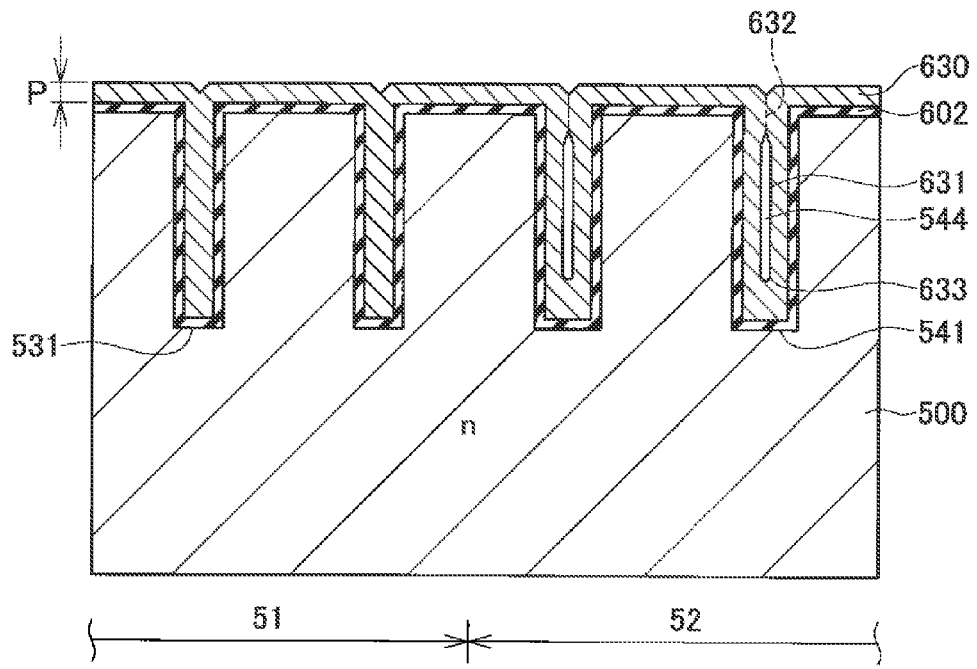
FIG. 4 is a diagram illustrating the method for manufacturing the semiconductor device according to the first embodiment.

Next, as shown in FIG. 4, a polysilicon layer 630 is deposited. The polysilicon layer 630 is filled inside the trenches 531 and is deposited along the inner walls of the trenches 541. The polysilicon layer 630 deposited along the inner wall of each trench 541 opposes itself and is separated from via a space (a void 544) on a separation surface 631 and are in contact with each other on a contact surface 632. A lower end of each separation surface 631 (in other words, a lower end of the void 544) is adjusted to as to be located deeper than a boundary between a body layer and a drift layer when forming the body layer in a step that will be described later. Since the trenches 531 are narrower in width than the trenches 541, the polysilicon layer 630 is filled into the trenches 531 in a state of not including a void and, at the same time, the polysilicon layer 630 is formed in the trenches 541 in a state of including the voids 544. By adjusting the width D11 of the trenches 531, the width D12 of the trenches 541, and a thickness P of the polysilicon layer 630 so as to satisfy D11<2P<D12, the polysilicon layer 630 inside the trenches 531 and the trenches 541 can be arranged in a state shown in FIG. 4. The polysilicon layer 630 filled into the trenches 531 becomes the gate electrodes 133. The polysilicon layer 630 funned inside the trenches 541 becomes the first layers 143.

Figure 5:
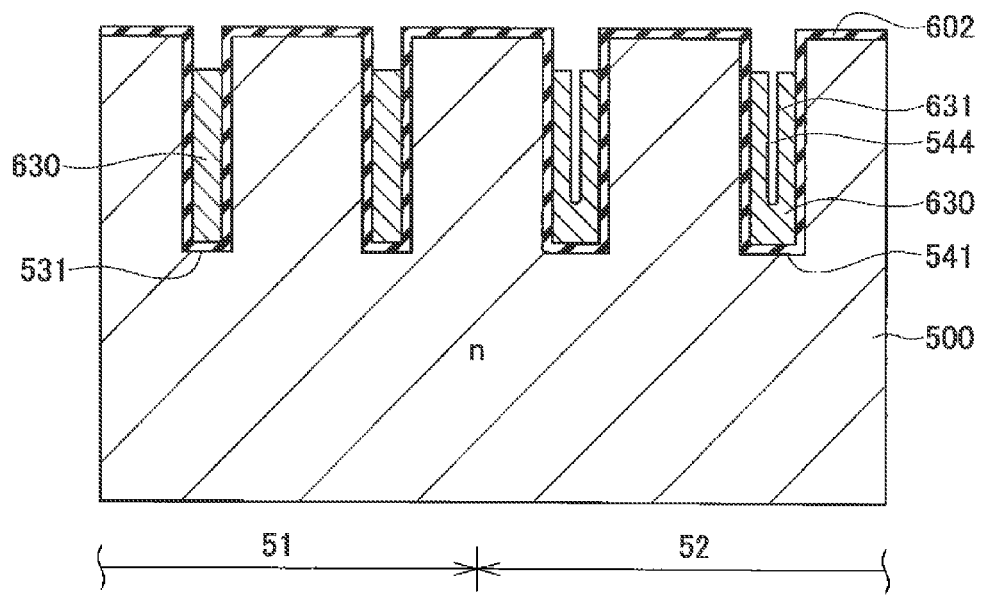
FIG. 5 is a diagram illustrating the method for manufacturing the semiconductor device according to the first embodiment.

Next, as shown in FIG. 5, an unnecessary portion of the polysilicon layer 630 is removed using a method such as dry etching. In the diode region 52, upper parts of the polysilicon layer 630 are removed and the separation surfaces 631 are exposed. Moreover, in this step, anisotropic etching is favorably performed using a method such as reactive ion etching in order to prevent excessive spreading of the separation surfaces 631.

Figure 6:
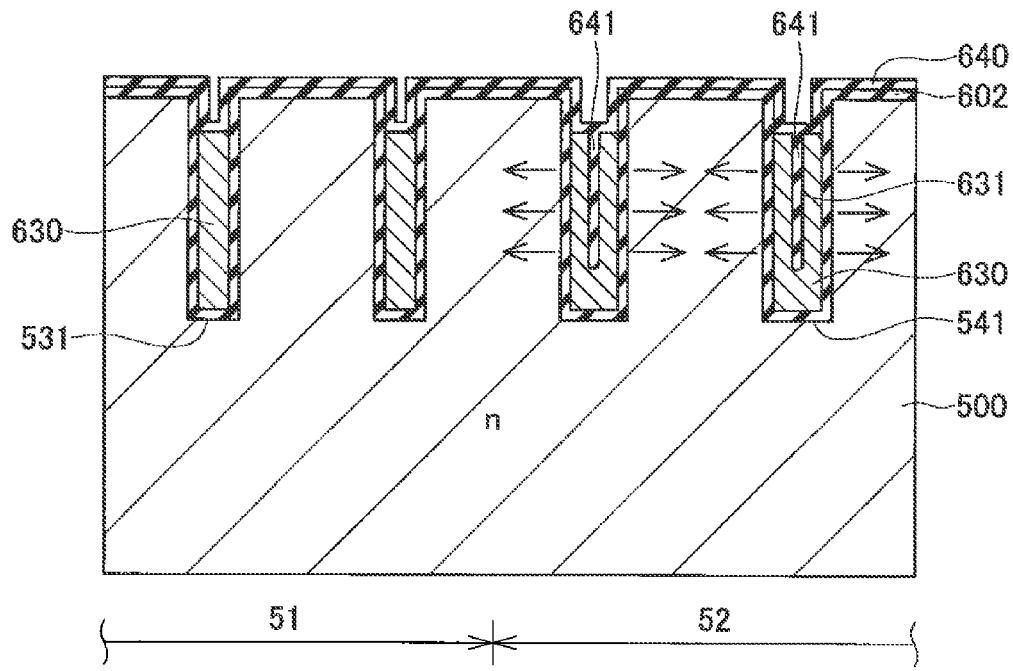
FIG. 6 is a diagram illustrating the method for manufacturing the semiconductor device according to the first embodiment.
Figure 7:
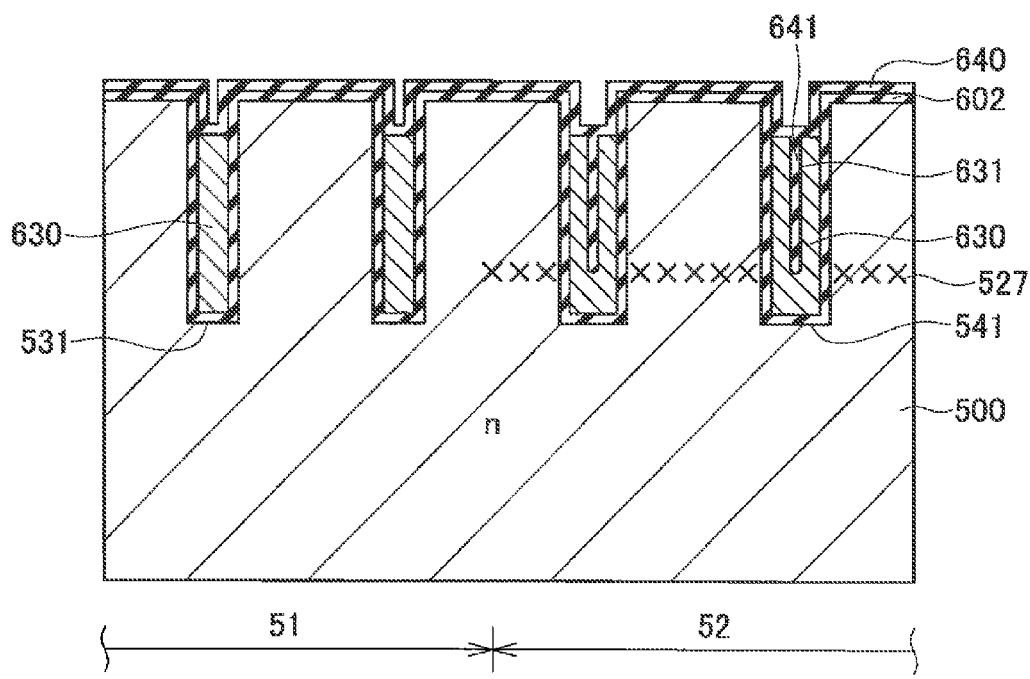
FIG. 7 is a diagram illustrating the method for manufacturing the semiconductor device according to the first embodiment.

Next, as shown in FIG. 6, surface oxidation of the polysilicon layer 630 is performed. Accordingly, an oxide layer 640 is formed on upper surfaces of the polysilicon layer 630 and upper surfaces of the oxide layer 602 which are exposed in FIG. 5. The oxide layer 640 is also formed on upper surfaces of the separation surfaces 631 of the polysilicon layer 630, and the voids 544 inside the trenches 541 are filled with the oxide layer 640. Void oxide layers 641 that are a part of the oxide layer 640 filled into the void are buried in the polysilicon layer 630. Since the void oxide layers 641 expand in excess of volumes of the voids 544, in a range in which the void oxide layers 641 are formed along a depth direction of the semiconductor wafer 500, the void oxide layers 641 pressure the first layers 143 in a direction from inside to outside of the trenches 541. In a range in which the void oxide layers 641 are not funned, the polysilicon layer 630 is not pressured. Therefore, due to the formation of the void oxide layers 641, as depicted by an arrow in FIG. 6, a stress that acts on the semiconductor wafer 500 in a range in which the void oxide layers 641 are formed is generated in the diode region 52. Due to this stress, as shown in FIG. 7, a crystal defect region 527 is formed in the semiconductor wafer 500. Since the crystal defect region 527 is formed with lower ends of the void oxide layers 641 as a starting point, by adjusting a depth of the lower ends of the void oxide layers 641 (or a depth of the lower ends of the voids 514), a position (depth) at which the crystal defect region 527 is formed can be adjusted.

Figure 8:
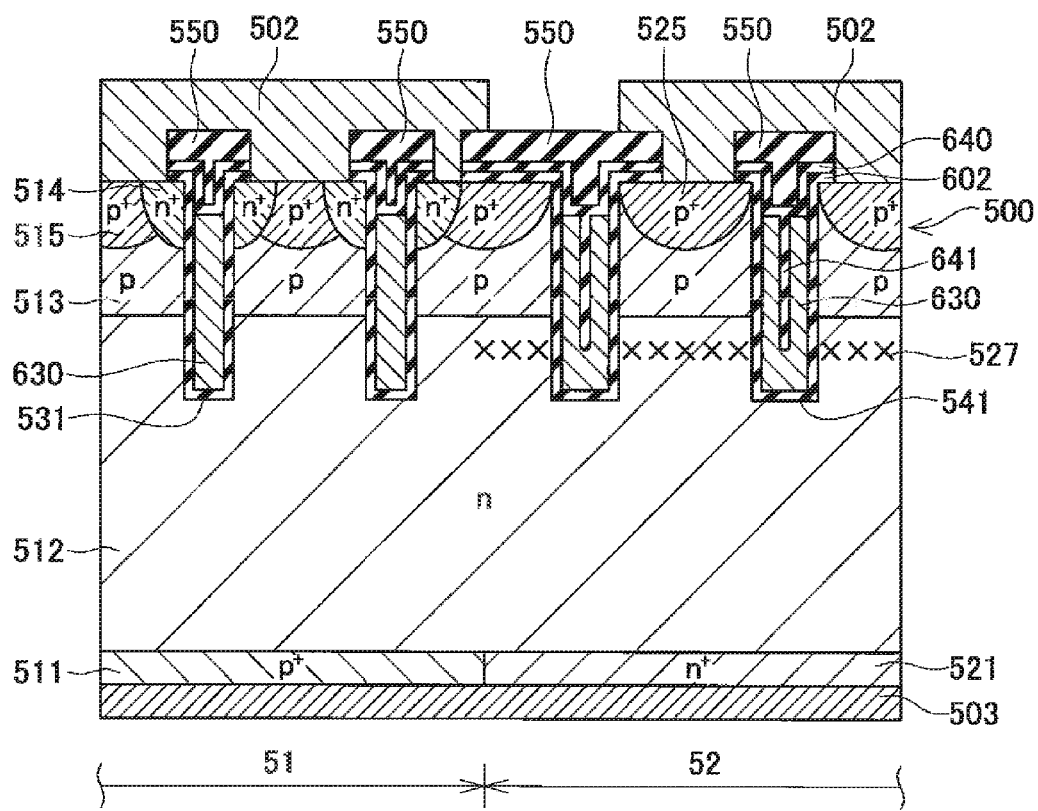
FIG. 8 is a diagram illustrating the method for manufacturing the semiconductor device according to the first embodiment.

Next, as shown in FIG. 8, semiconductor layers such as the collector layer 511, the cathode layer 521, the body layer 513, the emitter layer 514, the body contact layer 515, and the anode layer 525 are formed in the semiconductor wafer 500. Furthermore, the upper surface insulating film 550, the upper surface electrode 502, the lower surface electrode 503, and the like are formed on an upper surface or a lower surface of the semiconductor wafer 500. The crystal defect region 527 is positioned in a drill layer 512 of the diode region 52 and functions as a lifetime control region that reduces a lifetime of a carrier. By subjecting the semiconductor wafer 500 shown in FIG. 8 to dicing or the like, the semiconductor device 10 shown in FIG. 1 can be manufactured.

As described earlier, in the semiconductor device 10 according to the first embodiment, the second material which is the material of the second layers 144 is an oxide formed by oxidizing the first material which is the material of the first layers 143. The second layers 144 are formed in the heat treatment that is normally performed in the manufacturing process of the semiconductor device. Due to the formation of the void oxide layers 641 that become the second layers 144, the expansion of the volumes thereof, and pressuring of the polysilicon layer 630 that becomes the first layers 143 by the void oxide layers 641 that become the second layers 144 in the direction from inside to outside of the diode trenches, the crystal defect region 527 is formed in the semiconductor layer around the trenches 541. Since the lower ends of the void oxide layers 641 are located deeper than a boundary between the body layer 513 and the drift layer 512, the lifetime control region is formed in the diode drift layer. On the other hand, since the gate electrodes can be filled into the IGBT trenches in the state not including the voids, the crystal defect region 527 is not formed. A semiconductor device that enables the damage layer to be selectively formed only in the diode region without having to irradiate light ions or the like using a mask can be provided. Since the lifetime control region is formed in correspondence with the position of the diode trench, the alignment adjustment is not required and superior repeatability is achieved. According to the first embodiment, the manufacturing process can be simplified and the lifetime control region can be formed accurately.

(Modification)

Figure 9:
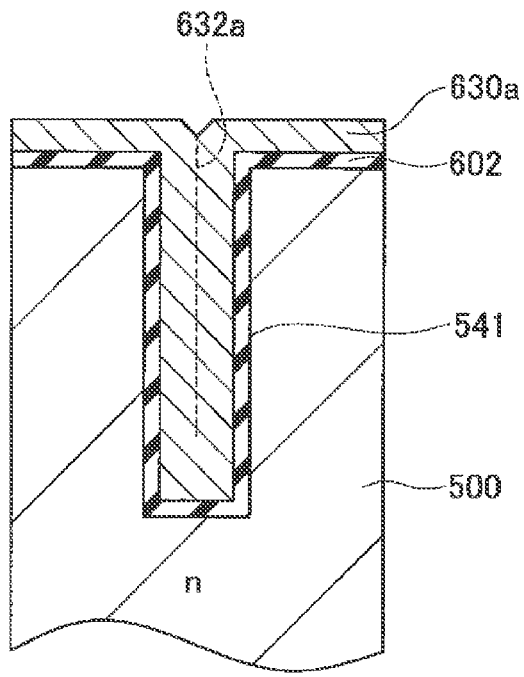
FIG. 9 is a diagram illustrating the method for manufacturing the semiconductor device according to the first embodiment.

A configuration of the first layer Which is in a state of including a void and which is formed in a diode trench is not limited to the trench 541 shown in FIG. 4 and the like. For example, as shown in FIG. 9, a design may be adopted in which a polysilicon layer 630a including a contact surface 632a but not a separation surface is formed inside each trench 541. An oxide film is formed on an upper surface of each contact surface 632a by performing surface oxidation of the polysilicon layers 630a, and a crystal defect region is formed by a stress that acts when the oxide film is generated in a similar manner to FIGS. 6 and 7.

Figure 10:
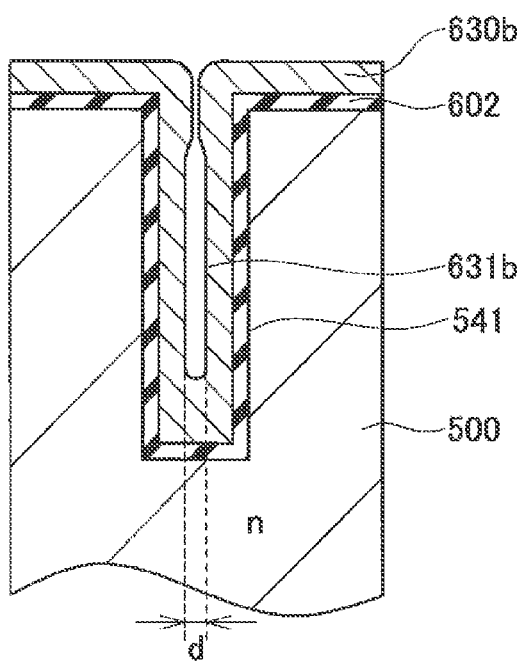
FIG. 10 is a diagram illustrating the method for manufacturing the semiconductor device according to the first embodiment.
Figure 11:
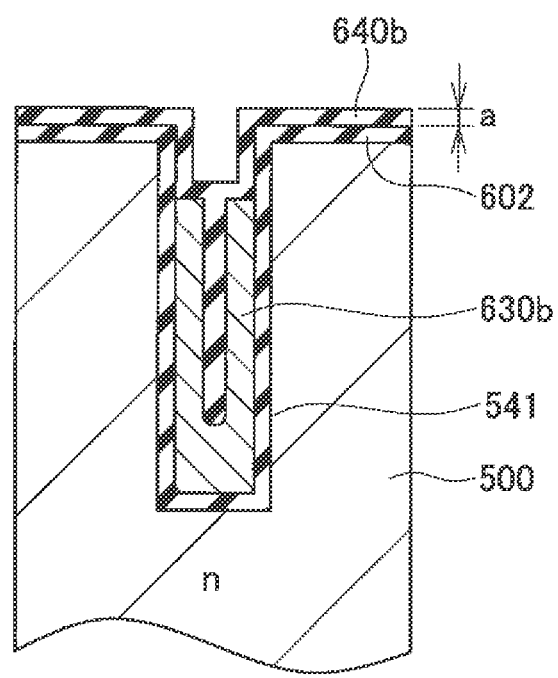
FIG. 11 is a diagram illustrating the method for manufacturing the semiconductor device according to the first embodiment.

In contrast, as shown in FIG. 10, a design may be adopted in which a polysilicon layer 630b including a separation surface 631b but not a contact surface is formed inside each trench 541. An oxide film 640b is formed on an upper surface of each separation surface 631b as shown in FIG. 11 by performing surface oxidation of the polysilicon layer 630b. By adopting a design in which a distance d of the opposing separation surface 631b shown in FIG. 10 and a thickness a of the oxide film 640b shown in FIG. 11 have a relationship expressed as 2a>d, a crystal defect region is formed by a stress that acts when the second layer is generated in a similar manner to FIGS. 6 and 7.

SECOND EMBODIMENT

Figure 12:
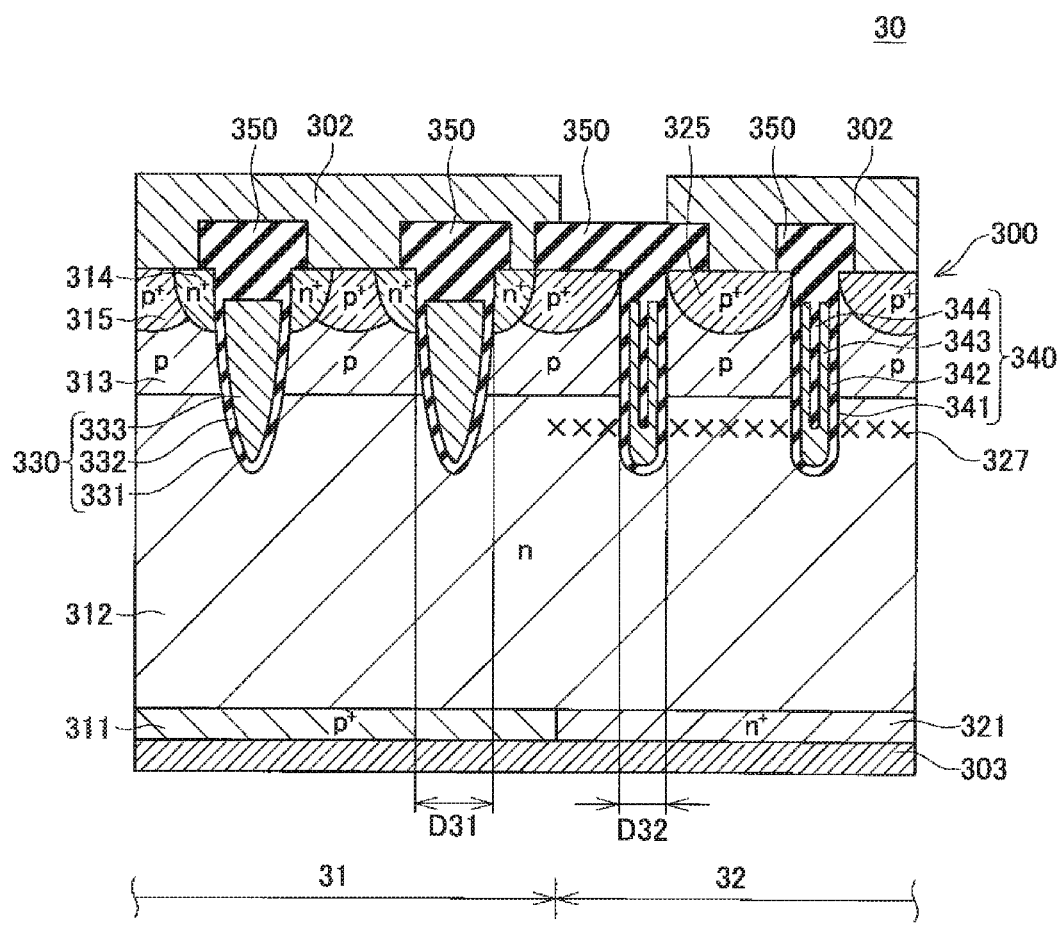
FIG. 12 is a cross sectional view of a semiconductor device according to a second embodiment.

A semiconductor device 30 shown in FIG. 12 is an RC-IGBT comprising a semiconductor substrate 300 in which an IGBT and a diode are formed. The semiconductor device 30 differs from the semiconductor device 10 in shapes of insulated gates 330 formed in an IGBT region 31 and dummy gates 340 formed in a diode region 32. In the insulated gates 330, a trench width of trenches 331 becomes narrower from an upper surface side to a lower surface side of the semiconductor substrate 300. In the dummy gates 340, a trench width of trenches 341 is approximately constant from the upper surface side of the semiconductor substrate 300 to a vicinity of bottom surfaces of the trenches 341. A trench width D32 of the dummy gates 340 is narrower than a trench width D31 of the insulated gates 330. Since other components are similar to those of the semiconductor device 10 shown in FIG. 1, overlapping descriptions will be omitted by replacing the hundreds among the reference numerals shown in FIG. 1 with three-hundreds shown in FIG. 12.

In the semiconductor device 30, the trench width of the trenches 331 of the insulated gates 330 becomes narrower from the upper surface side to the lower surface side of the semiconductor substrate 300. Therefore, in a manufacturing process of the semiconductor device 30, a void is less likely to be generated when filling polysilicon or the like that becomes gate electrodes 333. Meanwhile, since the trench width of the trenches 341 of the dummy gates 340 is approximately constant in a depth direction of the semiconductor substrate 300, when first layers 343 are formed at the same time the gate electrodes 333 are filled, voids are more likely to be generated in the first layers 343. By providing the trenches 331 with a shape such as that shown in FIG. 12, even if the trench width D32 of the dummy gates 340 is set narrower than the trench width D31 of the insulated gates 330, the first layers 343 in the state of including the voids can be formed in the trenches 341 and, at the same time, the gate electrodes 333 can be filled into the trenches 331 in the state of not including the void. Subsequently, in a similar manner to the first embodiment, second layers and a lifetime control region 327 can be formed by the heat treatment that is normally performed in the manufacturing process of the semiconductor device.

Figure 13:
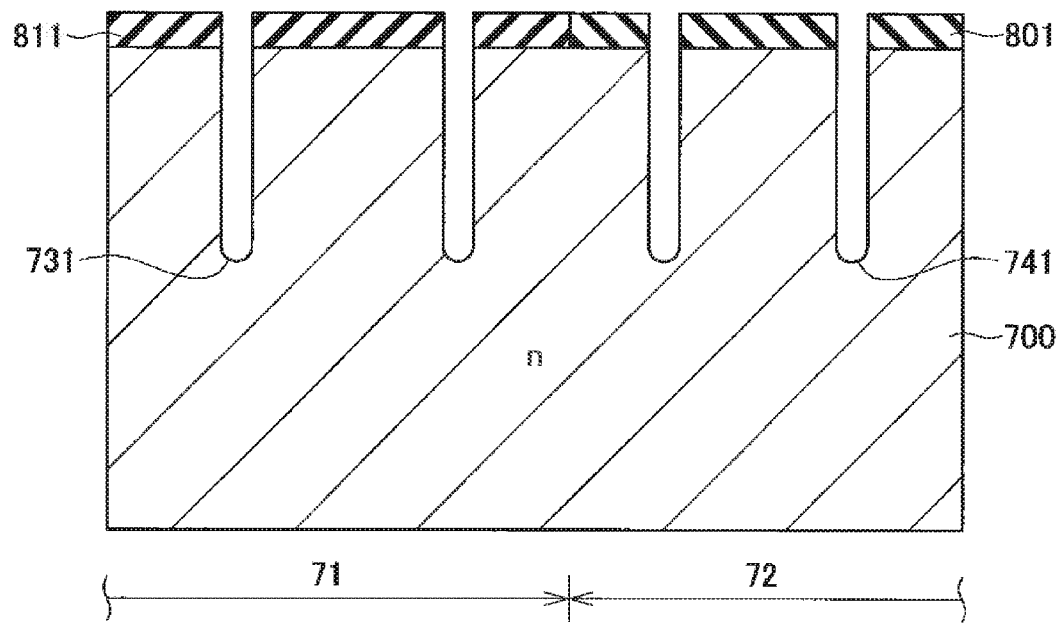
FIG. 13 is a diagram illustrating a method for manufacturing the semiconductor device according to the second embodiment.

A method for manufacturing the semiconductor device 30 will now be described. First, an n type semiconductor wafer 700 (silicon wafer) is prepared. Then, as shown in FIG. 13, a patterned mask 811 is formed on an upper surface of an IGBT region 71 and a patterned mask 801 is formed on an upper surface of a diode region 72 of the semiconductor wafer 700. The mask 801 is made of a silicon nitride film and the mask 811 is made of a silicon oxide film. Etching is performed in a state in which the masks 801 and 811 are formed by using an etchant (for example, KOH or a tetramethylammonium hydroxide (TMAH) solution) or plasma (for example, plasma mixed with $SF_6$, HBr, and $O_2$) which selectively etches silicon. Accordingly, as shown in FIG. 13, trenches 731 are formed in the IGBT region 71 and trenches 741 are formed in the diode region 72. Trench widths of the trenches 731 and the trenches 741 are approximately constant from an upper surface side of the semiconductor wafer 700 to a vicinity of bottom surfaces of the trenches 731 and 741.

Figure 14:
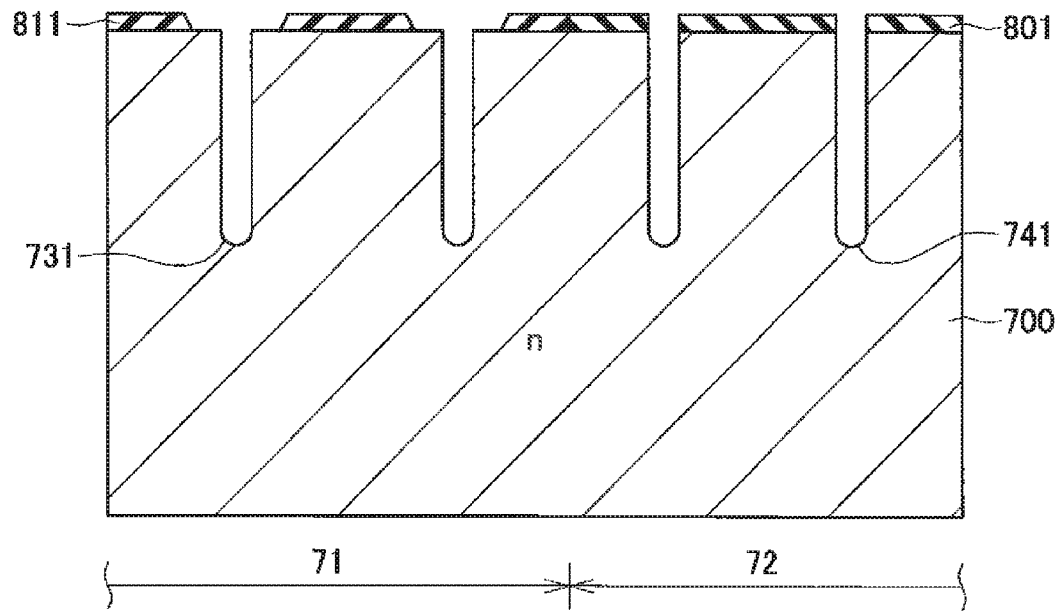
FIG. 14 is a diagram illustrating the method for manufacturing the semiconductor device according to the second embodiment.

Next, etching is performed using an etchant (for example, hydrofluoric acid) that selectively etches silicon oxide. Accordingly, as shown in FIG. 14, the mask 811 is partially removed and the upper surface of the semiconductor wafer 700 is exposed in a vicinity of the trenches 731.

Figure 15:
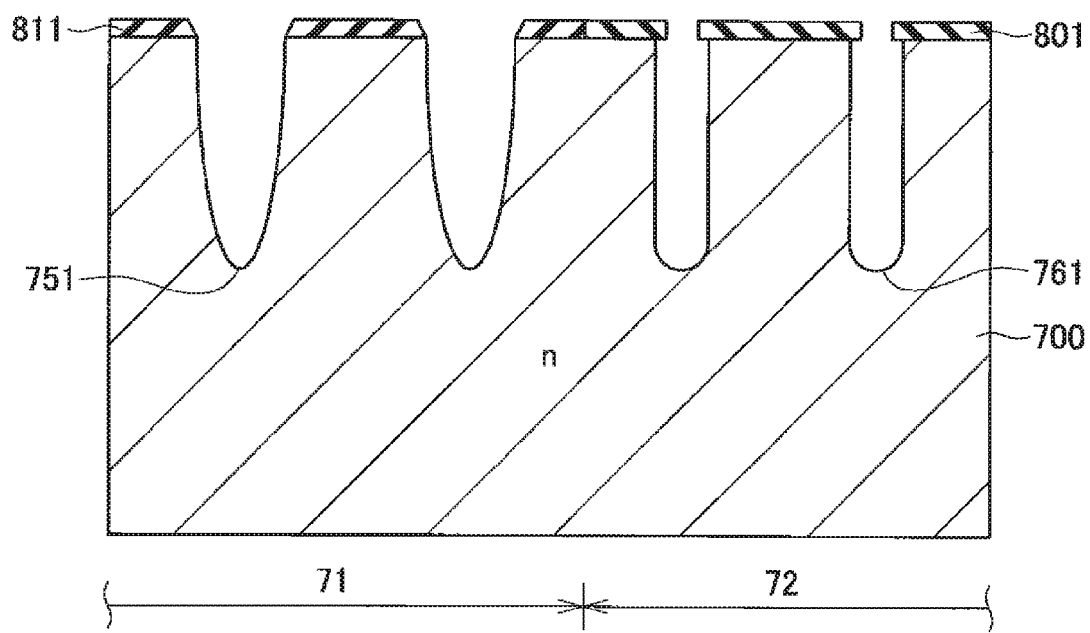
FIG. 15 is a diagram illustrating the method for manufacturing the semiconductor device according to the second embodiment.

Next, etching is once again performed using an etchant, plasma, or the like that selectively etches silicon. Accordingly, as shown in FIG. 15, the exposed portion of the semiconductor wafer 700 in the vicinity of the trenches 731 and a portion of an inner wail of each trench 731 are removed and trenches 751 are formed. A trench width of the trenches 751 becomes narrower from an upper surface side to a lower surface side of the semiconductor wafer 700. Moreover, an inner wall portion of each trench 741 is also removed to form a trench 761. A trench width of the trenches 761 is approximately constant in a depth direction of the semiconductor wafer 700. Subsequently, by removing both the mask 801 and the mask 811 and performing similar steps as those described in the first embodiment with reference to FIGS. 3 to 8, the semiconductor device 30 shown in FIG. 12 can be formed. When the gate electrodes 333 and polysilicon that becomes the first layers 343 are formed simultaneously in the same step, polysilicon can be filled into the trenches 751 and polysilicon in a state of including voids can be formed in the trenches 761 in a similar manner to FIG. 4. Subsequently, by performing thermal oxidation after partially removing the polysilicon in a similar manner to FIGS. 5 and 6, an oxide film that becomes a second layer 344 is formed inside each trench 761 and, in a similar manner to FIG. 7, stress is generated in a vicinity of the trenches 761 and a crystal defect region is formed. Furthermore, in a similar manner to FIG. 8, after forming other components of the semiconductor device 30 shown in FIG. 12, dicing is performed.

While the first and second embodiments and a modification thereof have been exemplified and described above, other methods may be used when forming first and second layers of a diode gate. For example, after forming the first layer in a state of including a void, a material that expands when thermally treated may be filled into the void as the second layer. In addition, for example, the first layer and a gate electrode need not be made of a same material. As already described in the above embodiments and the like, using the same material for the first layer and the gate electrode enables the first layer and the gate electrode to be formed simultaneously in a same step and is therefore favorable in terms of further reducing the number of steps in a manufacturing process of a semiconductor device.

Some of the features of the above embodiment will be described. In the above semiconductor device, preferably, a second material that is a material of the second layer may be an oxide of a first material that is a material of the first layer.

In addition, the present application may also provide a method for manufacturing the semiconductor device described above. This method of manufacturing comprises: filling a first material, which is a material of the first layer, into the diode trench in a state of including a void; and filling and expanding a second material which is a material of the second layer into the void of the filled first material. Furthermore, the second material may be an oxide of the first material, and in the expanding, the first material may be oxidized and expanded inside the void.

While examples of the present invention have been described in detail, such examples are merely illustrative and are not intended to limit the scope of claims. Techniques described in the scope of claims include various modifications and changes of the specific examples illustrated above.

It is to be understood that the technical elements described in the present description and the drawings exhibit technical usefulness solely or in various combinations thereof and shall not be limited to the combinations described in the claims at the time of filing. Furthermore, the techniques illustrated in the present description and the drawings are to achieve a plurality of objectives at the same time, whereby technical usefulness is exhibited by attaining any one of such objectives.

What is claimed is:

1. A semiconductor device comprising a semiconductor substrate in which a diode region and an IGBT region are formed, wherein the diode region comprises:
a first conductivity type anode layer exposed at an upper surface of the semiconductor substrate,
a first conductivity type diode body layer formed on a lower surface side of the first conductivity type anode layer, a second conductivity type diode drift layer formed on a lower surface side of the first conductivity type diode body layer, a second conductivity type cathode layer formed on a lower surface side of the second conductivity type diode drift layer, and having a higher density of second conductivity type impurities than in the second conductivity type diode drift layer, a first layer disposed within a diode trench reaching the second conductivity type diode drift layer from the upper surface of the semiconductor substrate, and a second layer disposed within the first layer, and having a lower end of which located deeper than a boundary between the first conductivity type diode body layer and the second conductivity type diode drift layer, the IGBT region comprises:

a second conductivity type emitter layer exposed at the upper surface of the semiconductor substrate, a first conductivity type IGBT body layer formed at a lateral side and a lower surface side of the second conductivity type emitter layer, and having a part of which exposed at the upper surface of the semiconductor substrate, a second conductivity type IGBT drift layer formed on a lower surface side of the first conductivity type IGBT body layer, a first conductivity type collector layer formed on a lower surface side of the second conductivity type IGBT drift layer, and an IGBT gate penetrating the first conductivity type IGBT body layer from the upper surface side of the semiconductor substrate and reaching the second conductivity type IGBT drift layer, the second layer pressures the first layer in a direction from inside to outside of the diode trench, a lifetime control region is formed in the second conductivity type diode drift layer at a depth of a lower end of the second layer, and a crystal defect density inside the lifetime control region is higher than a crystal defect density outside the lifetime control region.

2. The semiconductor device according to claim 1, wherein a second material, which is a material of the second layer, is an oxide of a first material, which is a material of the first layer.

3. A method for manufacturing a semiconductor device comprising: providing a semiconductor substrate in which a diode region and an IGBT region are formed, wherein the diode region comprises:

a first conductivity type anode layer exposed at an upper surface of the semiconductor substrate, a first conductivity type diode body layer formed on a lower surface side of the first conductivity type anode layer, a second conductivity type diode drift layer formed on a lower surface side of the first conductivity type diode body layer, a second conductivity type cathode layer formed on a lower surface side of the second conductivity type diode drift layer, and having a higher density of second conductivity type impurities than in the second conductivity type diode drift layer, a first layer disposed within a diode trench reaching the second conductivity type diode drift layer from the upper surface of the semiconductor substrate, and a second layer disposed within the first layer, and having a lower end of which located deeper than a boundary between the first conductivity type diode body layer and the second conductivity type diode drift layer, the IGBT region comprises:

a second conductivity type emitter layer exposed at the upper surface of the semiconductor substrate, a first conductivity type IGBT body layer formed at a lateral side and a lower surface side of the second conductivity type emitter layer, and having a part of which exposed at the upper surface of the semiconductor substrate, a second conductivity type IGBT drift layer formed on a lower surface side of the first conductivity type IGBT body layer, a first conductivity type collector layer formed on a lower surface side of the second conductivity type IGBT drift layer, and an IGBT gate penetrating the first conductivity type IGBT body layer from the upper surface side of the semiconductor substrate and reaching the second conductivity type IGBT drift layer, wherein the second layer pressures the first layer in a direction from inside to outside of the diode trench, wherein a lifetime control region is formed in the second conductivity type diode drift layer at a depth of a lower end of the second layer, and wherein a crystal defect density inside the lifetime control region is higher than a crystal defect density outside the lifetime control region, filling a first material, which is a material of the first layer, into the diode trench in a state of including a void, and filling and expanding a second material, which is a material of the second layer, into the void of the filled first material.

4. The method of manufacturing according to claim 3, wherein the second material is an oxide of the first material, and in the expanding, the first material is oxidized and expanded inside the void.

* * * * *